(12) United States Patent
Mimata et al.

(10) Patent No.: US 6,579,057 B2
(45) Date of Patent: Jun. 17, 2003

(54) CONVEYOR APPARATUS FOR DIES AND SMALL COMPONENTS

(75) Inventors: Tsutomu Mimata, Akiruno (JP); Hiroshi Watanabe, Fussa (JP); Yasushi Sato, Musashimurayama (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 0 days.

(21) Appl. No.: 09/874,599

(22) Filed: Jun. 5, 2001

(65) Prior Publication Data

US 2001/0051092 A1 Dec. 13, 2001

(30) Foreign Application Priority Data

Jun. 8, 2000 (JP) ........................................ 2000-172262

(51) Int. Cl.[7] .............................................. B65G 47/91
(52) U.S. Cl. .................. 414/627; 414/752.1; 414/626; 414/225.01; 29/741; 29/831; 156/556
(58) Field of Search ................................. 414/403, 626, 414/627, 225.01, 752.1, 751.1, 753.1, 222.01; 29/741, 831; 156/556

(56) References Cited

U.S. PATENT DOCUMENTS

| | | | | |
|---|---|---|---|---|
| 4,095,699 A | * | 6/1978 | O'Neil | 414/626 X |
| 4,762,460 A | * | 8/1988 | Stoll | 414/250 |
| 5,876,556 A | * | 3/1999 | Takanami | 414/752.1 X |
| 5,919,024 A | * | 7/1999 | Fujimori | 414/752.1 X |

* cited by examiner

*Primary Examiner*—Frank E. Werner

(57) ABSTRACT

A conveyor apparatus for conveying, for instance, dies, comprising: an X-axis moving block movable in an X-axis direction that is a lead frame conveying direction, a Y-axis moving block installed on the X-axis moving block and moved in a Y-axis direction that is perpendicular to the X-axis direction, a nozzle holder installed on the Y-axis moving block so as to be movable upward and downward, a Z-axis guide rail installed on the X-axis moving block and has an inclined part that rises from a die pick-up position side toward a die bonding position side, a Z-axis moving plate moved upward and downward along the Z-axis guide rail and is connected to the nozzle holder, and a suction chucking nozzle that holds the dies by vacuum suction and is installed so as to be moved upward and downward on the nozzle holder and together with the nozzle holder.

1 Claim, 2 Drawing Sheets

CONVEYOR APPARATUS FOR DIES AND SMALL COMPONENTS

BACKGROUND OF THE INVENTION

1. Field of the Invention

The present invention relates to a conveyor apparatus for dies and the like small components used in, for instance, a die bonding apparatus, tape bonding apparatus, die packing apparatus.

2. Prior Art

In die bonding apparatuses, tape bonding apparatuses and die packing apparatuses, dies are conveyed in the following manner. As seen from FIG. 2, a wafer ring (not shown) is fastened to the outer circumference of a wafer sheet 2 to which dies 1 are bonded, and this wafer ring is moved in the directions of the X and Y axes by an XY table (not shown). The X-axis direction is the conveying direction of lead frames or substrates (hereafter collectively referred to as "lead frames") 5 that will be described later, and the Y-axis direction is the direction that is perpendicular to the conveying direction of the lead frames 5. A suction holding body 3 is installed beneath the wafer sheet 2, and a push-up needle 4 is installed inside the suction holding body 3 so that the push-up needle 4 is moved upward and downward. The lead frames 5 to which dies 1 are bonded are conveyed in the X-axis direction by a frame feeder 6.

A conventional die conveying apparatus is constructed in the following manner: an X-axis moving block 51 is installed on a base 50 so that this X-axis moving block 51 slides in the X-axis direction. The X-axis moving block 51 is driven via an X-axis feed screw (not shown) by an X-axis motor 52 that is mounted on the base 50. The upper and lower end portions of a Z-axis feed screw 53, which is installed in a vertical orientation (i.e., in the direction of the Z-axis) on the X-axis moving block 51, are supported so as to be rotated. The Z-axis feed screw 53 is driven by a Z-axis motor 54 that is mounted on the X-axis moving block 51. The upper and lower end portions of a Z-axis guide rod 55, which is disposed parallel to the Z-axis feed screw 53, are fastened to the X-axis moving block 51; and a Z-axis moving block 56, which is disposed in the Y-axis direction, is installed on the Z-axis guide rod 55 so that the Z-axis moving block 56 can slide. A Z-axis feed nut (not shown) is fastened to the Z-axis moving block 56 and screw-engaged with the Z-axis feed screw 53.

The left and right end portions of a Y-axis feed screw 60 that is oriented in the Y-axis direction are supported on the Z-axis moving block 56 so that the Y-axis feed screw 60 is rotated. The Y-axis feed screw 60 is driven by a Y-axis motor 61 mounted on the Z-axis moving block 56. The left and right end portions of a Y-axis guide rod 62, which is disposed parallel to the Y-axis feed screw 60, are fastened to the Z-axis moving block 56; and a Y-axis moving block 63, which is disposed in the direction of the Z-axis, is installed on the Y-axis guide rod 62 so that the Y-axis moving block 63 can slide. A Y-axis feed nut 64 is fastened to the Y-axis moving block 63 and screw-engaged with the Y-axis feed screw 60.

A nozzle holder 70 is installed on the Y-axis moving block 63 so that the nozzle holder 70 can slide in the vertical direction (i.e., in the direction of the Z-axis), and a suction chucking nozzle 71 is fastened to this nozzle holder 70. The suction chucking nozzle 71 is urged downward by a spring (not shown) so as to contact a stopper 72 that is fastened to the Y-axis moving block 63. The suction chucking nozzle 71 vacuum-suctions the dies 1 with a vacuum means (not shown).

The operation of the above prior art apparatus will be described.

As shown in FIG. 2A, when the suction chucking nozzle 71 approaches the die 1 that is to be picked up in the die pick-up position 7, the push-up needle 4 is raised. As a result, the die 1 is caused to contact the suction chucking nozzle 71, and the suction chucking nozzle 71 holds the die 1 by vacuum suction. Next, the Z-axis motor 54 and Y-axis motor 61 are rotated in the reverse direction. When the Z-axis motor 54 is rotated in the reverse direction, the Z-axis feed screw 53 is rotated to raise the Z-axis moving block 56, and the nozzle holder 70 and suction chucking nozzle 71 are moved upward together with the Y-axis moving block 63. When the Y-axis motor 61 is rotated in the reverse direction, the Y-axis feed screw 60 is rotated and raises the nozzle holder 70 and suction chucking nozzle 71 together with the Y-axis moving block 63 in the Y-axis direction toward the lead frame 5. As a result, the suction chucking nozzle 71 is moved to a point above the die bonding position 8 as shown in FIG. 2B. Afterward, the Z-axis motor 54 is rotated in the forward direction so that the nozzle holder 70 and suction chucking nozzle 71 are lowered together with the Y-axis moving block 63, and the die 1 is bonded to the lead frame 5. After this die bonding, a reverse operation of the above-described steps is performed so that the nozzle holder 70 and suction chucking nozzle 71 are moved to the die pick-up position 7.

In die bonding apparatuses, in order to reduce the amount of spaces, the wafer sheet 2 and lead frame 5 are not disposed in a plane arrangement. Instead, these elements are disposed so that part of the wafer sheet 2 is positioned beneath the frame feeder 6. As a result, it is necessary to move the suction chucking nozzle 71 vertically (in the direction of the Z-axis) for the distance that is defined by adding a spare amount of height to the vertical height of the wafer sheet 2 and lead frame 5.

In the prior art, heavy objects such as the Z-axis moving block 56, Y-axis motor 61, Y-axis guide rod 62, Y-axis feed screw 60, Y-axis moving block 63 and nozzle holder 70 are driven up and down by the Z-axis motor 54. Accordingly, the Z-axis motor needs to have a great amount of driving output. Further, in the prior art, it is impossible to perform high-speed vertical driving.

SUMMARY OF THE INVENTION

Accordingly, an object of the present invention is to provide a conveyor apparatus for conveying dies and small components in which the weight of the constituting elements that are driven upward and downward is greatly reduced.

It is another object to provide a conveying apparatus that does not need a motor for vertically driving the suction chucking nozzle, so that the cost of the apparatus can be greatly reduced, and so that the suction chucking nozzle is driven upward and downward at a high speed.

The above objects are accomplished by a unique structure for a conveying apparatus that comprises:
- an X-axis moving block which is moved in the X-axis direction that constitutes a conveying direction of a lead frame, etc.,
- a Y-axis moving block which is installed on the X-axis moving block and moved in the Y-axis direction that is perpendicular to the X-axis direction,
- a nozzle holder which is installed on the Y-axis moving block so that the nozzle holder is movable upward and downward, a Z-axis guide rail which is installed on the X-axis moving block and has an inclined part that rises from the die pick-up position side toward the die bonding position side, a Z-axis moving plate which is moved upward and downward along the Z-axis guide rail and is connected to the nozzle holder, and a suction chucking nozzle that holds dies by vacuum suction and is installed so as to be movable upward and downward on the nozzle holder and moved upward and downward together with the nozzle holder.

DETAILED DESCRIPTION OF THE INVENTION

Figure 1A:
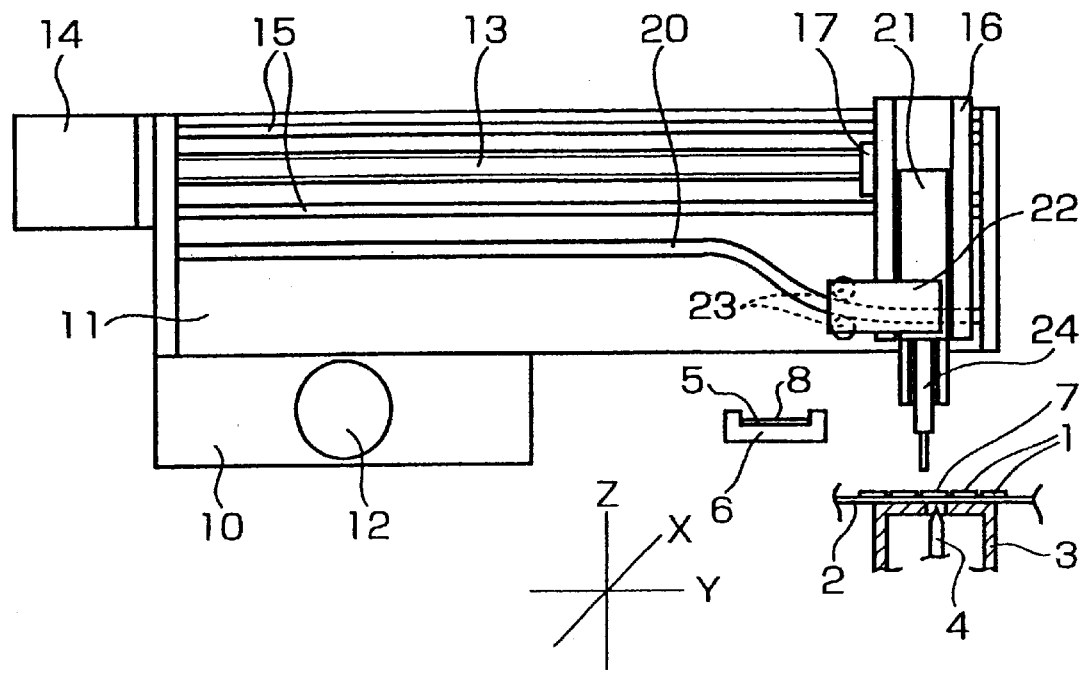
FIGS. 1A and 1B are front views of the die conveyor apparatus according to one embodiment of the present invention.

One embodiment of the present invention will be described with reference to FIG. 1. Since the elements indicated by the reference numerals 1 through 8 are the same as those of FIG. 2, a detailed description of these elements will be omitted. The X-axis direction and the Y-axis direction are the same as in FIG. 2.

The structure of the die conveyor apparatus will be described first.

An X-axis moving block 11 is installed on a base 10 so that the X-axis moving block 11 can slide in the X-axis direction. The X-axis moving block 11 is driven via an X-axis feed screw (not shown) by an X-axis motor 12 that is mounted on the base 10. A Y-axis feed screw 13 is disposed in the Y-axis direction on the X-axis moving block 11. The left and right end portions of the Y-axis feed screw 13 are supported on the X-axis moving block 11 so that the Y-axis feed screw 13 can rotate. The Y-axis feed screw 13 is driven by a Y-axis motor 14 that is mounted on the X-axis moving block 11. A Y-axis guide rod 15 is installed on the X-axis moving block 11 so as to be parallel to the Y-axis feed screw 13. The left and right end portions of this Y-axis guide rod 15 are fastened to the X-axis moving block 11, and a Y-axis moving block 16 is installed on the Y-axis guide rod 15 so that the Y-axis moving block 16 can slide on the Y-axis guide rod 15. A Y-axis feed nut 17 is fastened to the Y-axis moving block 16 and screw-engaged with the Y-axis feed screw 13.

A Z-axis guide rail 20 is fastened to the X-axis moving block 11. The Z-axis guide rail 20 has a portion that is inclined from the die bonding position side 8 toward the die pick-up position side 7. Furthermore, a nozzle holder 21 is installed on the Y-axis moving block 16 so that the nozzle holder 21 can slide upward and downward, and a Z-axis moving plate 22 is fastened to this nozzle holder 21. Rollers 23 are installed in a rotatable fashion on the Z-axis moving plate 22 so that the rollers 23 holds the Z-axis guide rail 20 from above and below. A suction chucking nozzle 24 is installed on the nozzle holder 21 so as to be slidable upward and downward. The suction chucking nozzle 24 is urged upward by a spring (not shown) so that the suction chucking nozzle 24 contacts the nozzle holder 21 in a manner that allows the suction chucking nozzle 24 to move upward and downward together with the nozzle holder 21. Vacuum suction is applied to the die 1 by a vacuum means (not shown) so that the suction chucking nozzle 24 holds the die 1. Thus, the suction chucking nozzle 24 is movable upward and downward together with the nozzle holder 21; and also the suction chucking nozzle 24 is movable upward and downward relative to the nozzle holder 21.

Next, the operation of the above-described conveying apparatus will be described.

As seen from FIG. 1A, when the suction chucking nozzle 24 approaches the die 1 that is to be picked up in the die pick-up position 7, the push-up needle 4 is raised. As a result, the die 1 is caused to contact the suction chucking nozzle 24, and the suction chucking nozzle 24 holds the die 1 by vacuum suction.

Figure 1B:
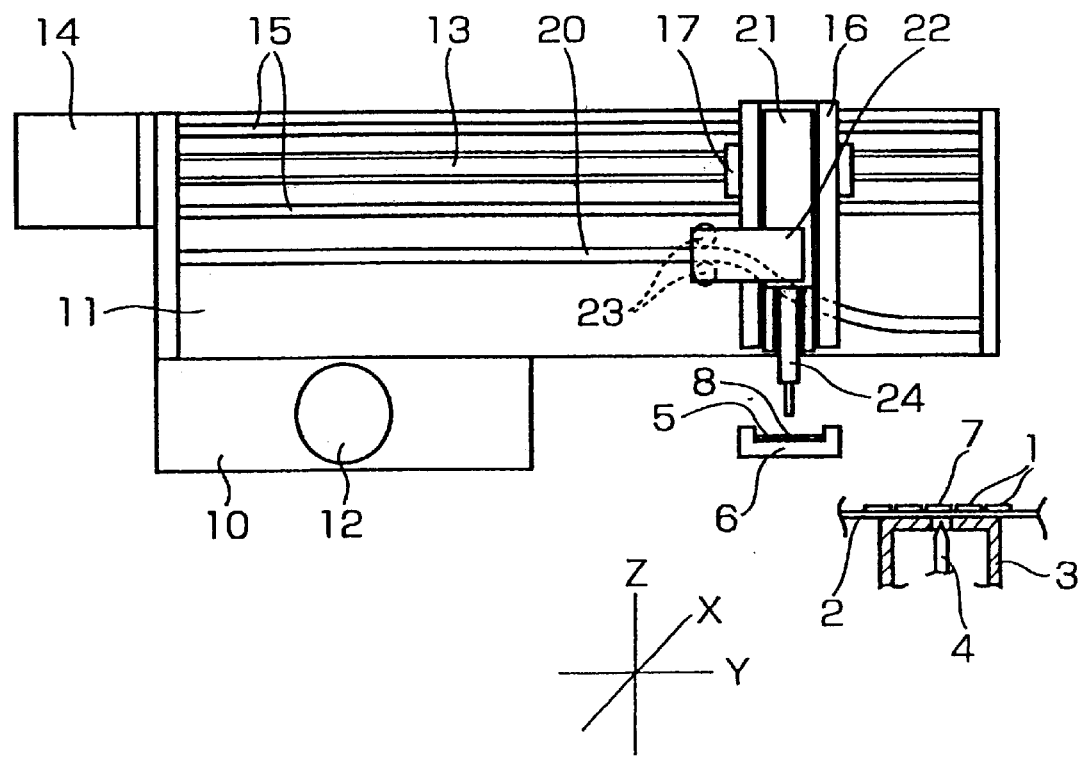

Next, the Y-axis motor is rotated in the reverse direction. This causes the Y-axis feed screw 13 to rotate so that the Y-axis moving block 16 is moved in the Y-axis direction toward the lead frame 5. As a result, the Z-axis moving plate 22 and nozzle holder 21 are raised along the Z-axis guide rail 20 via the rollers 23, so that the suction chucking nozzle 24 is moved to a point above the die bonding position 8 as shown in FIG. 1B. Afterward, the suction chucking nozzle 24 is lowered by a driving means (not shown), and the die 1 is bonded to the lead frame 5.

Following this bonding operation, reverse steps of the above operation are performed, and the nozzle holder 21 and suction chucking nozzle 24 are moved to the die pick-up position 7.

Figure 2A:
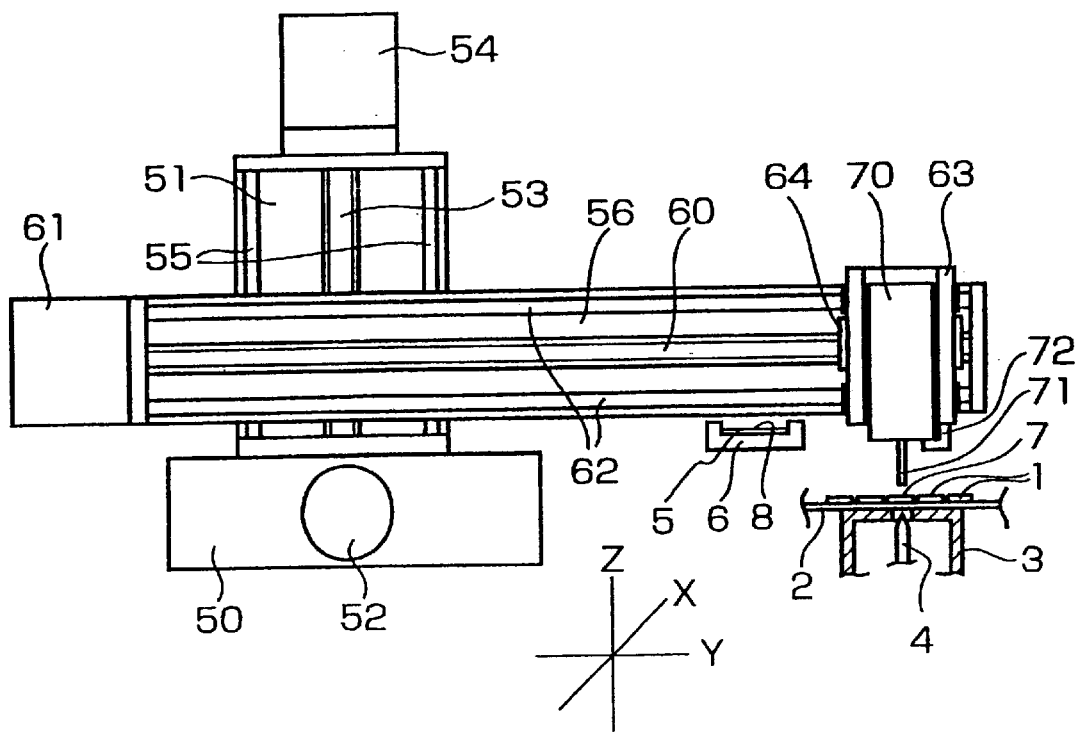
FIGS. 2A and 2B are front views of a conventional die conveyor apparatus.
Figure 2B:
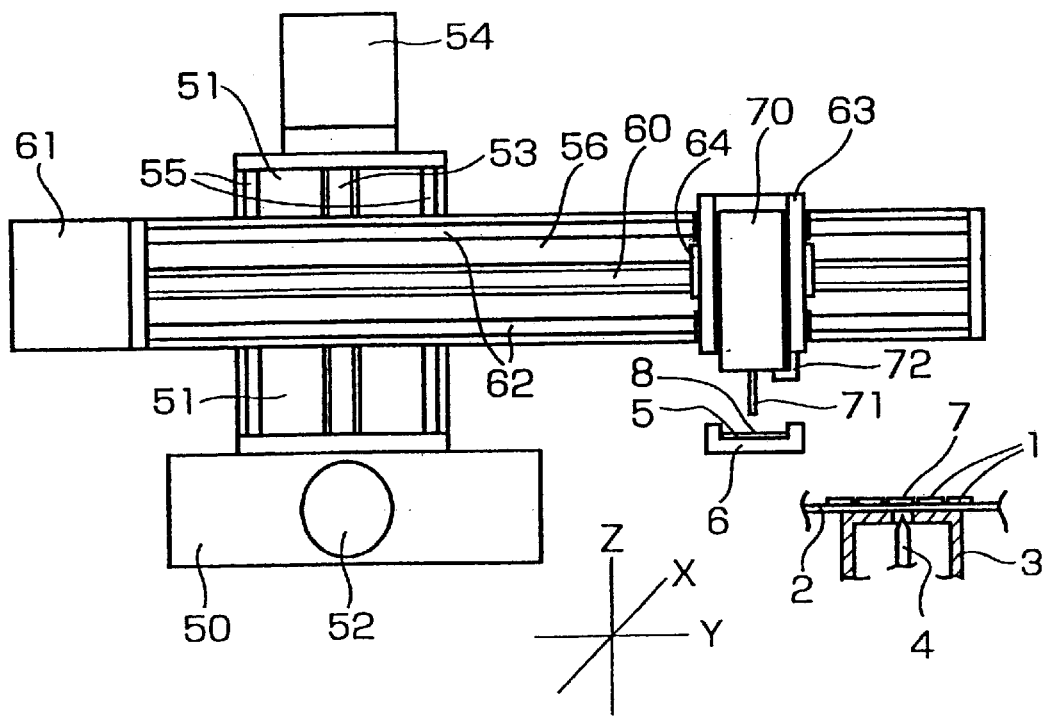

As is clear from the comparison between FIGS. 1A and 1B and FIGS. 2A and 2B, the embodiment of FIGS. 1A and 1B does not require the Z-axis motor 54 shown in the prior art shown in FIGS. 2A and 2B. Furthermore, the elements that are driven up and down are only the rollers 23, Z-axis moving plate 22, nozzle holder 21 and suction chucking nozzle 24, which are extremely light. Accordingly, the cost of the conveying apparatus can be greatly reduced, and the suction chucking nozzle 24 can be driven upward and downward at a high speed.

In the above embodiment, the dies 1 are picked up from a wafer sheet 2. However, the present invention can be used for picking up dies accommodated in a tray. Furthermore, it is also possible to use the present invention for putting dies picked up from a wafer sheet into a tray. The present invention is not limited to convey dies 1, and it can be used to convey other small components of other kinds.

As described in detail in the above, the conveying apparatus of the present invention comprises: an X-axis moving block which is moved in the X-axis direction that is a conveying direction of a lead frame, a Y-axis moving block which is installed on the X-axis moving block and moved in the Y-axis direction that is perpendicular to the X-axis direction, a nozzle holder which is installed on the Y-axis moving block so as to be movable upward and downward, a Z-axis guide rail which is installed on the X-axis moving block and has an inclined part that rises from the die pick-up position side toward the die bonding position side, a Z-axis moving plate which is moved upward and downward along the Z-axis guide rail and is connected to the nozzle holder, and a suction chucking nozzle which holds the dies by vacuum suction and is installed so as to be moved upward and downward on the nozzle holder and moved upward and downward together with the nozzle holder.

Accordingly, the weight of elements that are driven upward and downward can be reduced greatly, and a motor for moving the suction chucking nozzle upward and downward is not required. As a result, the cost of the apparatus is greatly reduced, and it is possible to drive the suction chucking nozzle up and down at a high speed.

What is claimed is:

1. A conveyor apparatus for dies, comprising:

a base;

an X-axis moving block which is moved in an X-axis direction that constitutes a conveying direction of a lead frame;

an X-axis moving means provided on said base for moving said X-axis moving block in said X-axis direction;

a Y-axis moving block which is provided on said X-axis moving block and moved in a Y-axis direction that is perpendicular to said X-axis direction;

a Y-axis moving means provided on said X-axis moving block for moving said Y-axis moving block in said Y-axis direction;

a nozzle holder which is provided on said Y-axis moving block so that said nozzle holder is movable upward and downward in a Z-axis direction;

a Z-axis guide rail which is provided on said X-axis moving block and extends along said Y-axis direction, said Z-axis guide rail having an inclined part that rises in said Z-axis direction from a die pick-up position side toward a die bonding position side;

a Z-axis moving plate coupled to said Y-axis moving block which is moved upward and downward as said Z-axis moving plate moves along said Z-axis guide rail and said Y-axis moving block moves in said Y-axis direction, said Z-axis moving plate being coupled to said nozzle holder such that said nozzle holder moves in said Z-axis direction as said Y-axis moving block moves in said Y-axis direction;

a suction chucking nozzle provided on said nozzle holder which holds said dies by vacuum suction and is provided so as to be movable upward and downward in said Z-axis direction relative to said nozzle holder and moved upward and downward in said Z-axis direction together with said nozzle holder; and a means for moving said suction chucking nozzle relative to said nozzle holder provided on said nozzle holder.

* * * * *